US006800321B1

(12) United States Patent
Ashworth

(10) Patent No.: US 6,800,321 B1
(45) Date of Patent: Oct. 5, 2004

(54) REDUCED AC LOSSES IN HTS COATED CONDUCTORS

(75) Inventor: Stephen P. Ashworth, Santa Fe, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 10/161,132

(22) Filed: May 29, 2002

(51) Int. Cl.[7] .......................... B05D 5/12; H01L 39/24
(52) U.S. Cl. .................. 427/62; 427/547; 427/598; 505/400; 505/434; 505/470; 505/727; 29/599
(58) Field of Search .......................... 29/599; 505/300, 505/400, 430, 434, 470, 725, 727; 427/62, 472, 532, 547, 598

(56) References Cited

U.S. PATENT DOCUMENTS

| 5,220,232 A | * | 6/1993 | Rigney et al. ............. 310/90.5 |
| 5,542,506 A | * | 8/1996 | McMichael et al. ........ 188/267 |
| 5,606,668 A | | 2/1997 | Shwed ................... 395/200.11 |
| 5,648,322 A | * | 7/1997 | Doi et al. .................... 505/501 |
| 5,757,098 A | * | 5/1998 | Higuchi et al. ............ 310/90.5 |
| 5,835,726 A | | 11/1998 | Shwed et al. .............. 395/200.9 |
| 6,088,804 A | | 7/2000 | Hill et al. ................... 713/201 |
| 6,189,035 B1 | | 2/2001 | Lockhart et al. ............ 709/229 |

FOREIGN PATENT DOCUMENTS

| EP | 0910 197 | 4/1999 |
| JP | 124955 A2 | 4/2000 |
| WO | WO 99/48303 | 9/1999 |
| WO | WO 00/31963 | 6/2000 |
| WO | WO 01/04773 | 1/2001 |

OTHER PUBLICATIONS

"MULTOPS: A Data–Structure for Bandwidth Attack Detection," Gil et al., p. 1–12, Aug. 15, 2001.
News Releases, Recourse Technologies, Press Release, p. 1–4, Sep. 27, 2000.
"CERT Advisory CA–1996–21 TCP SYN Flooding and IP Spoofing Attacks," Carnegie Melon Software Engineering Institute p. 1–9, Nov. 29, 2000.
"Firm Eyes DoS Attacks," Network World v.18n4. p. 14, Jan. 22, 2001.
Messmer and Pappalardo, "A year after Meltdown: No Silver Bullet for DoS," Network World Fusion News, p. 1–7, Feb. 5, 2001.
Messmer, "Start–Ups Vie to Defeat DoS Attacks,"Network World, v.18n6, pp. 37–38, Feb. 5, 2001.
Hulme, "Companies Declare War on Denial–of–Service Attacks," Informationweek v.824, p. 32, Feb. 12, 2001.
NIKSUN NetDetector Sell Sheet.
"MULTOPS: A Data–Structure for Bandwidth Attack Detection," Gil et al., p. 1–12, Aug. 15, 2001.

* cited by examiner

Primary Examiner—Brian K. Talbot
(74) Attorney, Agent, or Firm—Milton D. Wyrick

(57) ABSTRACT

Methods for reducing hysteresis losses in superconductor coated ribbons where a flux distribution is set into the superconductor coated ribbon prior to the application of alternating current.

15 Claims, 1 Drawing Sheet

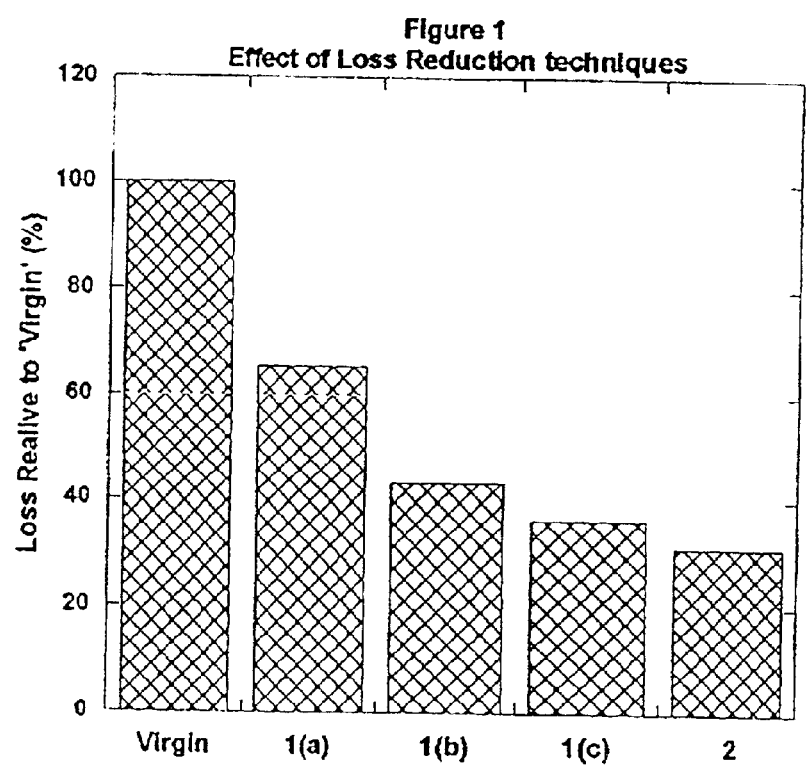

REDUCED AC LOSSES IN HTS COATED CONDUCTORS

The present invention generally relates to high-temperature superconductors and, more specifically to reducing alternating current losses in HTS coated conductors. This invention was made with Government support under Contract No. W-7405ENG-36 awarded by the U.S. Department of Energy. The Government has certain rights in the invention.

BACKGROUND OF THE INVENTION

The YBCO coated superconductor appears to have a promising future in such applications as power cables, magnets, electric motors, and current limiters, to name only a few. However, it is likely that such applications will require the A coated conductor to be exposed to time-varying magnetic fields or carry timevarying electrical currents. Such currents could be the common sinusoidal alternating current fields and/or direct currents with a "ripple." In these situations, energy losses will occur as the magnetic field associated with the current enters and leaves the superconductor. Losses like this are termed hysteresis losses. The particular details of the manner in which magnetic flux enters and moves within the superconductor can have a profound influence on the hysteresis losses. Unfortunately, hysteresis losses generate heat within the superconductor that increases the refrigeration required to maintain the superconductor in the superconducting state.

Hysteresis losses can have significant economic and technical impact on the application of superconductors to real world situations. They may make some applications uneconomic or even unviable because of the engineering problems they create.

Typically, the YBCO superconductor coated conductor is manufactured as a high aspect ratio ribbon, approximately 1 cm wide. With the YBCO superconductor itself only on the order of 1 $\mu$m to 10 $\mu$m thick, an aspect ratio of about $10^4$ is produced. This very large aspect ratio dominates the mechanism by which magnetic flux and electric current distribute within the superconductor, and thereby the hysteresis losses. In particular, a high aspect ratio has been shown to cause very non-uniform distribution of the magnetic field within the conductor, with the local magnetic field being enhanced at the edges of the conductor ribbon. This is often referred to as "strip" geometry effects, which are considered to produce anomalously high alternating current hysteresis losses in the superconductor compared to what is expected, and has been measured, in lower aspect ratio superconductors, such as circular, often referred to as elliptical geometry.

It is to be understood that the higher loss is due to the geometry and not the superconducting material itself. The same YBCO material in the form of a circular cross section, for instance, would exhibit very different magnetic field distributions than when in a ribbon configuration, and the hysteresis losses would have very different dependence on applied field or transported current. The level of losses in the coated ribbon conductors has been demonstrated to be sufficiently high so as to limit severely their use in electrical power engineering applications. Some means of reducing these hysteresis losses in ribbon superconductors is therefore needed in order to enable the widespread use of this valuable material.

It is therefore an object of the present invention to reduce significantly reduce the hysteresis losses in superconductor coated conductors.

It is another object of the present invention, to provide superconducting conductors in a ribbon configuration for use in electrical power applications.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, a method of reducing hysteresis losses in superconductor coated ribbon having a critical current comprises the steps of establishing a transport electrical current greater than the critical current in the superconductor coated ribbon for a period of time sufficient to establish pinning of flux lines Within the superconductor coated ribbon.

In a further aspect of the present invention and in accordance with its objects and principles a method of reducing hysteresis losses in a superconductor coated ribbon having a face and a critical temperature comprises the steps of applying a magnetic field to the superconductor coated ribbon in a direction perpendicular to the face; and cooling the superconductor coated ribbon to a temperature below the critical temperature; whereby a magnetic flux distribution is established inside the superconductor coated ribbon.

In a yet further aspect of the present invention, and in accordance with its objects and principles, a method of reducing hysteresis losses in a superconductor coated ribbon having a face and a critical temperature comprises the steps of cooling the superconductor coated ribbon to a temperature lower than the critical temperature; and applying a magnetic field to the superconductor coated ribbon in a direction perpendicular to the face; whereby a magnetic flux distribution is established inside the superconductor coated ribbon.

In a still further aspect of the present invention, and in accordance with its objects and principles, a method of reducing hysteresis losses in a superconductor coated ribbon deposited onto a metallic substrate and having a critical temperature comprise the steps of applying a direct current magnetic field to the superconductor coated superconductor ribbon; and cooling the superconductor coated ribbon to a temperature below the critical temperature; whereby a magnetic field distribution is established inside the superconductor coated ribbon.

In a still further aspect of the present invention, and in accordance with its objects and principles, a method of reducing hysteresis losses in superconductor coated ribbon having a transition temperature comprises the steps of winding an electrical conductor around the superconductor coated ribbon; and passing a direct current through the electrical conductor; and cooling the superconductor coated ribbon to below the critical temperature; whereby a magnetic field distribution is established inside the superconductor coated ribbon.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 1 is a graph illustrating the improvement in hysteresis losses in YBCO coated conductors using methods of the present invention and compared to an untreated "virgin" superconductor.

DETAILED DESCRIPTION

The present invention provides methods for reducing hysteresis losses in YBCO coated conductors. The invention can be most easily understood through attention to the following description.

The aim of the present invention is to reduce hysteresis losses in superconductor coated conductors that are due to time varying transport currents or magnetic fields. The present invention achieves this loss reduction through modification of the magnetic flux distribution within the superconductor during an ac cycle away from the distribution that would be set up due to the geometry of the conductor and the high aspect ratio of the ribbon. The present invention accomplishes this without any significant alteration of the ribbon geometry.

There are two distinct methods employed by the present invention to provide the reduction in hysteresis losses in YBCO coated ribbon conductors. The first involves modifying the flux distribution and concomitantly the current distribution so that it does not follow the normal course for a high aspect ratio conductor. The second involves changing the rate of ingress and egress of flux into and out of the conductor during an ac cycle.; These two methods can be achieved by different means and can be used independently, either singly or together as needed to provide the desired reduction in hysteresis losses in a superconductor coated conductor.

The present invention teaches several methods for modifying the flux distribution in a superconductor-coated conductor; although the primary function of each is to "freeze" a flux distribution into the superconductor before an ac field or current is applied. This setting of the flux distribution inhibits the so-call "strip" distribution from forming.

The first method for reducing hysteresis losses in YBCO coated conductors involves applying a dc transport current to the conductor that is greater than the critical current, the current generating an electric field along the conductor that is typically in excess of 10 $\mu$V/cm. The presence of an electric field is evidence that magnetic flux lines are mobile, and that the Lorentz Force, which is proportional to the current, on the flux lines is sufficient to overcome any pinning and allow flux flow. The dc transport current is then removed; after only a brief period of time, on the order of 100 ms, and the flux lines attach to nearby pinning centers. Even though a current is flowing in the superconducting strip, and the "strip like" distribution might be expected to form, the flux line mobility while the current is flowing is sufficient to fill the entire superconductor with current and magnetic flux, and not allow the local current density and magnetic. flux to be enhanced near the edges of the ribbon.

Subsequently, when an ac current or field is applied to the superconductor, the existing flux distribution does not allow the flux to become enhanced near the edges of the ribbon, thereby lowering the hysteresis losses. The preexisting flux distribution may be considered to have been "frozen" into the superconductor, which means that the flux lines will not move until sufficient force is applied to them. This can be achieved only if a sufficiently high current to develop a flux flow voltage is passed through the superconductor. This pre-existing flux distribution will remain in place for a considerable period of time, until flux creep destroys it, particularly at lower temperatures.

The second method involves applying a low level magnetic field to the superconducting ribbon face and the coated conductor is cooled through its critical temperature ("Field cooling"). The applied magnetic field forces flux into the entire superconductor and generates a pre-existing flux distribution that does not allow the natural strip like high loss distribution to be established during the ac cycles. This magnetic field could be generated externally, or could be generated internally by the coated conductor itself. In fact, the field can even be pulsed on and off to achieve the desired flux pinning. This flux distribution will remain in place for a considerable period of time at low temperatures, unless a magnetic force is applied that is large enough to destroy superconductivity, or a large transport current is passed through the superconductor.

The third method applies a relatively higher magnetic field perpendicular to the face of the superconductor when the temperature of the superconductor is below its critical temperature. This field must be large enough to force flux at least into the edges of the superconductor to effect a reduction of losses. However, the further the flux penetrates into the superconductor, the lower the losses will become. In this embodiment as well, a preexisting flux distribution is generated in the superconductor that does not allow ac cycles to produce the natural strip-like high hysteresis losses. This magnetic field also can be generated externally, or internally if the superconducting ribbon is wound into a coil. It should be noted that this magnetic field does not need to be a dc field. As in the above embodiment, the magnetic field can even be pulsed on and off.

The fourth method requires applying a "moderate" direct current to the superconducting ribbon during the cooling of the superconducting ribbon through its critical temperature, which generates a magnetic field distribution in the superconductor. Above the critical temperature, the ribbon is not superconductive, and the magnetic field can move freely throughout the ribbon. As the ribbon is cooled through the transition temperature, the flux distribution is "frozen" into the superconductor very quickly. At this point, the direct current can be removed. This direct current can be carried by the superconducting layer itself, or normal metal layer, such as silver, applied over the superconducting layer, or by normal metal wires or films, such as silver or copper, applied at the edge regions of the superconducting ribbon. The current can even be carried by the metallic substrate of the superconductor-coated ribbon. However the current is applied it results in a flux distribution in the superconductor that inhibits the natural strip like losses when an ac magnetic field or transport current is applied.

The method of changing the rate of ingress and egress from the superconductor during the ac cycle involves again establishing a pre-existing magnetic flux distribution in the superconductor, but accomplishing this in a different manner than described above so that the rate change is effected. Here, a wire or film is wound spirally around and in close proximity to the superconductor, and a direct current is passed thought the wire or film. To minimize the current required to pass through the coiled wire or film, the flux distribution should be fixed in the superconductor as it is cooled through its superconducting transition temperature. The flux lines will then be "pinned" inside the superconductor and the direct current can be terminated.

This procedure differs from the methods described above where the applied flux is allowed to move inside the superconductor. Here, the applied flux is oriented perpendicularly to the flux generated by a subsequently applied field or transport current. This orientation provides magnetic flux lines in the superconductor. Magnetic flux lines in superconductors have marked reluctance to cut across each other. This reluctance manifests itself in a slowing of flux motion in the superconductor. Since hysteresis losses in a superconductor are directly related to the rate of change of the flux, any slowing of this rate of change, as is accomplished with the present invention, results in a reduction of these losses.

Referring now to FIG. 1, there can be seen a comparison of reduced losses relative to an untreated YBCO coated ribbon for various methods taught herein, each carrying an ac current. These data represent a YBCO coated conductor an ac transport current having a frequency of 100 Hz after being treated with the various methods taught herein.

As seen, the untreated YBCO coated ribbon is at 100%. The first modified flux distribution method ribbon had a loss reduction of approximately 35%, certainly a significant reduction. However, as shown, the second modified flux distribution method exhibited a 58% reduction, while the third method reduced losses by approximately 60%. The greatest reduction in this test was afforded by the flux rate of change method where a loss reduction of approximately 70% was attained. Although these tests were not conducted under optimum conditions, they do demonstrate the efficacy of the present invention in greatly reducing the hysteresis losses in YBCO coated ribbons. It is anticipated that with optimization, even better results can be realized.

The foregoing description of the embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of reducing hysteresis losses in a superconductor coated ribbon having a critical current comprising the steps of:
    establishing a transport electrical current greater than said critical current in said superconductor coated ribbon for a period of time sufficient to establish pinning of flux lines within said superconductor coated ribbon;
    whereby hysteresis losses in said superconductor coated ribbon are reduced.

2. The method as described in claim 1, wherein said period of time is approximately 100 ms.

3. A method of reducing hysteresis losses in a superconductor coated ribbon having a face and a critical temperature comprising the steps of:
    applying a magnetic field to said superconductor coated ribbon in a direction perpendicular to said face; and
    cooling said superconductor coated ribbbon to a temperature below said critical temperature;
    whereby a magnetic flux distribution is established inside said superconductor coated ribbon reducing said hysteresis losses in said superconductor coated ribbon.

4. The method as described in claim 3, wherein said magnetic field is applied by a magnetic field external to said superconductor coated ribbon.

5. The method as described in claim 3, wherein said magnetic field is applied by passing an electrical current through said superconductor coated ribbon.

6. A method of reducing hysteresis losses in a superconductor coated ribbon having a face and a critical temperature comprising the steps of:
    cooling said superconductor coated ribbon to a temperature lower than said critical temperature; and
    applying a magnetic field to said superconductor coated ribbon in a direction perpendicular to said face;
    whereby a magnetic flux distribution is established inside said superconductor coated ribbons and said hysteresis losses in said superconductor coated ribbon are reduced.

7. The method as described in claim 6, wherein said superconductor coated ribbon is wound into a coil and said magnetic field is applied by an electrical current passing through said coiled superconductor coated ribbon.

8. A method of reducing hysteresis losses in a superconductor coated ribbon deposited onto a metallic substrate and having a critical temperature comprising the steps of:
    applying a direct current magnetic field to said superconductor coated superconductor ribbon; and
    cooling said superconductor coated ribbon to a temperature below said critical temperature;
    whereby a magnetic field distribution is established inside said superconductor coated ribbon and said hysteresis losses in said superconductor coated ribbon are reduced.

9. The method as describe in claim 8, wherein said direct current magnetic field is applied by way of direct current passed through said superconductor coated ribbon.

10. The method as described in claim 8, wherein said direct current magnetic field is applied by way of direct current passing through metal wires arranged over and in close proximity to said superconductor coated ribbon.

11. The method as described in claim 8, wherein said direct current magnetic field is applied by way of direct current passing through metal wires located at the edges of said superconductor coated ribbon.

12. The method as described in claim 8, wherein said direct current magnetic field is applied by way of direct current passing through said metallic substrate of said superconductor coated ribbon.

13. A method of reducing hysteresis losses in superconductor coated ribbon having a transition temperature comprising the steps of:
    winding an electrical conductor around said superconductor coated ribbon;
    passing a direct current through said electrical conductor; and
    cooling said superconductor coated ribbon to below said critical temperature;
    whereby a magnetic field distribution is established inside said superconductor coated ribbon and said hysteresis losses in said superconductor coated ribbon is reduced.

14. The method as described in claim 13 wherein said electrical conductor is a metal wire.

15. The method as described in claim 13 wherein said electrical conductor is an electrically conductive film.

* * * * *